United States Patent
Rotberg

(10) Patent No.: US 10,791,715 B1
(45) Date of Patent: Oct. 6, 2020

(54) TRACKING DEVICE

(71) Applicant: Christopher Rotberg, Rancho Mission Viejo, CA (US)

(72) Inventor: Christopher Rotberg, Rancho Mission Viejo, CA (US)

(*) Notice: Subject to any disclaimer, the term of this patent is extended or adjusted under 35 U.S.C. 154(b) by 204 days.

(21) Appl. No.: 16/180,645

(22) Filed: Nov. 5, 2018

Related U.S. Application Data

(60) Provisional application No. 62/591,928, filed on Nov. 29, 2017.

(51) Int. Cl.
*A01K 27/00* (2006.01)
*G01C 21/12* (2006.01)
*H05K 1/18* (2006.01)
*H05K 7/14* (2006.01)

(52) U.S. Cl.
CPC .......... *A01K 27/009* (2013.01); *A01K 27/001* (2013.01); *G01C 21/12* (2013.01); *H05K 1/18* (2013.01); *H05K 7/1427* (2013.01); *H05K 2201/10037* (2013.01); *H05K 2201/10151* (2013.01); *H05K 2201/10159* (2013.01)

(58) Field of Classification Search
CPC .... A01K 27/009; A01K 27/00; A01K 27/001; A01K 27/006; A01K 27/007; A01K 27/008
See application file for complete search history.

(56) References Cited

U.S. PATENT DOCUMENTS

| | | | |
|---|---|---|---|
| 3,478,344 A * | 11/1969 | Hurd William Sprech | ................ G08B 26/007 340/7.63 |
| 4,536,755 A * | 8/1985 | Holzgang | .......... G08B 21/0446 200/61.52 |
| 4,673,936 A * | 6/1987 | Kotoh | ....................... G01S 1/68 342/385 |
| 8,035,560 B1 | 10/2011 | Glodz et al. | |
| 8,351,895 B2 | 1/2013 | Penix et al. | |
| 8,448,607 B2 | 5/2013 | Giunta | |
| 8,514,070 B2 * | 8/2013 | Roper | .................... G08B 21/22 340/539.13 |
| D695,258 S | 12/2013 | Hauser et al. | |
| 8,783,212 B2 | 7/2014 | Bellon et al. | |
| 8,976,724 B2 | 3/2015 | Hauser et al. | |
| 9,449,487 B1 | 9/2016 | Spitalny | |
| 9,693,536 B1 | 7/2017 | Dana | |

(Continued)

FOREIGN PATENT DOCUMENTS

WO WO2014116189 7/2014

*Primary Examiner* — Kristen C Hayes
(74) *Attorney, Agent, or Firm* — Eric Karich; Karich & Associates

(57) ABSTRACT

A tracking device has a buckle body with an interlocking portion that enables the buckle body to be removably jointed with a mating body. The buckle body further includes an internal chamber and a planar tag receiving area surrounded by a frame, which receives an identification tag. Electronics are to be positioned within the internal chamber, the electronics comprising a printed circuit board mounted on and operably connected with a battery. The internal chamber is shaped to accommodate the electronics so that they fit securely and snugly, with minimal movement therebetween. The printed circuit board includes a computer processor, a computer memory, an accelerometer, and a transceiver for communicating with the computer network.

8 Claims, 4 Drawing Sheets

(56) References Cited

U.S. PATENT DOCUMENTS

| | | | |
|---|---|---|---|
| 9,861,080 B1* | 1/2018 | Hathway | A01K 11/008 |
| 10,420,325 B2* | 9/2019 | Czarnecky | G01S 19/14 |
| 2015/0119679 A1 | 4/2015 | Huang | |
| 2015/0250143 A1* | 9/2015 | Klossner | A01K 15/021 |
| | | | 119/719 |
| 2017/0311573 A1* | 11/2017 | Sigmon | A01K 27/009 |
| 2018/0110205 A1* | 4/2018 | Czarnecky | G01S 19/14 |
| 2019/0387714 A1* | 12/2019 | Jennings | A01K 27/001 |

* cited by examiner

TRACKING DEVICE

CROSS-REFERENCE TO RELATED APPLICATIONS

This application for a utility patent claims the benefit of U.S. Provisional Application No. 62/591,928, filed Nov. 29, 2017.

BACKGROUND OF THE INVENTION

Field of the Invention

This invention relates generally to tracking devices, and more particularly to a tracking buckle that includes a tracking device mounted in a side release buckle which may be incorporated into a range of products, including pet collars, luggage, and any other products that may incorporate such a buckle.

Description of Related Art

Various products incorporate tracking technology for tracking various persons, pets, objects, etc. One example of such technology, incorporated herein by reference, is disclosed in Spitalny, U.S. Pat. No. 9,449,487, which teaches a communication and tracking system for pets. The pet communication and tracking system comprises a location module for determining the location of the pet and a communication module that allows a pet owner to determine the location of their pet as well. The pet communication and tracking system will also notify users when their pet leaves a predetermined geographic location.

Ergezer, WO. 2014116189, teaches a similar belt tracking system that includes a strap and a buckle for securing the strap to a pet, children, the elderly, patients, etc. The system includes rechargeable batteries mounted within the strap, and a GPS-based tracker which is concealed in a buckle.

Other reference include the following: U.S. Pat. Nos. 8,035,560, 8,783,212, 8,448,607, 9,693,536 and US 2015/0119679, all of which are incorporated herein by reference in their entirety.

SUMMARY OF THE INVENTION

The present invention teaches certain benefits in construction and use which give rise to the objectives described below.

The present invention provides a tracking device for tracking a location of the tracking device via a computer network, and for receiving an identification tag. The tracking device includes a buckle body with an interlocking portion that enables the buckle body to be removably jointed with a mating body. The buckle body further includes an internal chamber and a planar tag receiving area surrounded by a frame that is shaped to receive an identification tag. Electronics are to be positioned within the internal chamber, the electronics comprising a printed circuit board mounted on and operably connected with a battery. The internal chamber is shaped to accommodate the electronics so that they fit securely and snugly, with minimal movement therebetween. The printed circuit board comprises a computer processor, computer memory, an accelerometer, and a transceiver for communicating with the computer network.

A primary objective of the present invention is to provide a tracking device having advantages not taught by the prior art.

Another objective is to provide a tracking device that is integrated into a buckle that may be used for fastening a collar onto a pet, person, or object.

A further objective is to provide a tracking device that includes a mounting structure for mounting an identification tag on a front surface of the buckle.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above-described drawing figures illustrate the invention, a tracking device 10 which may be incorporated into a range of products, including pet collars, luggage, and any other products that may incorporate a buckle, to enable tracking of a person, pet, or other object.

Figure 1:
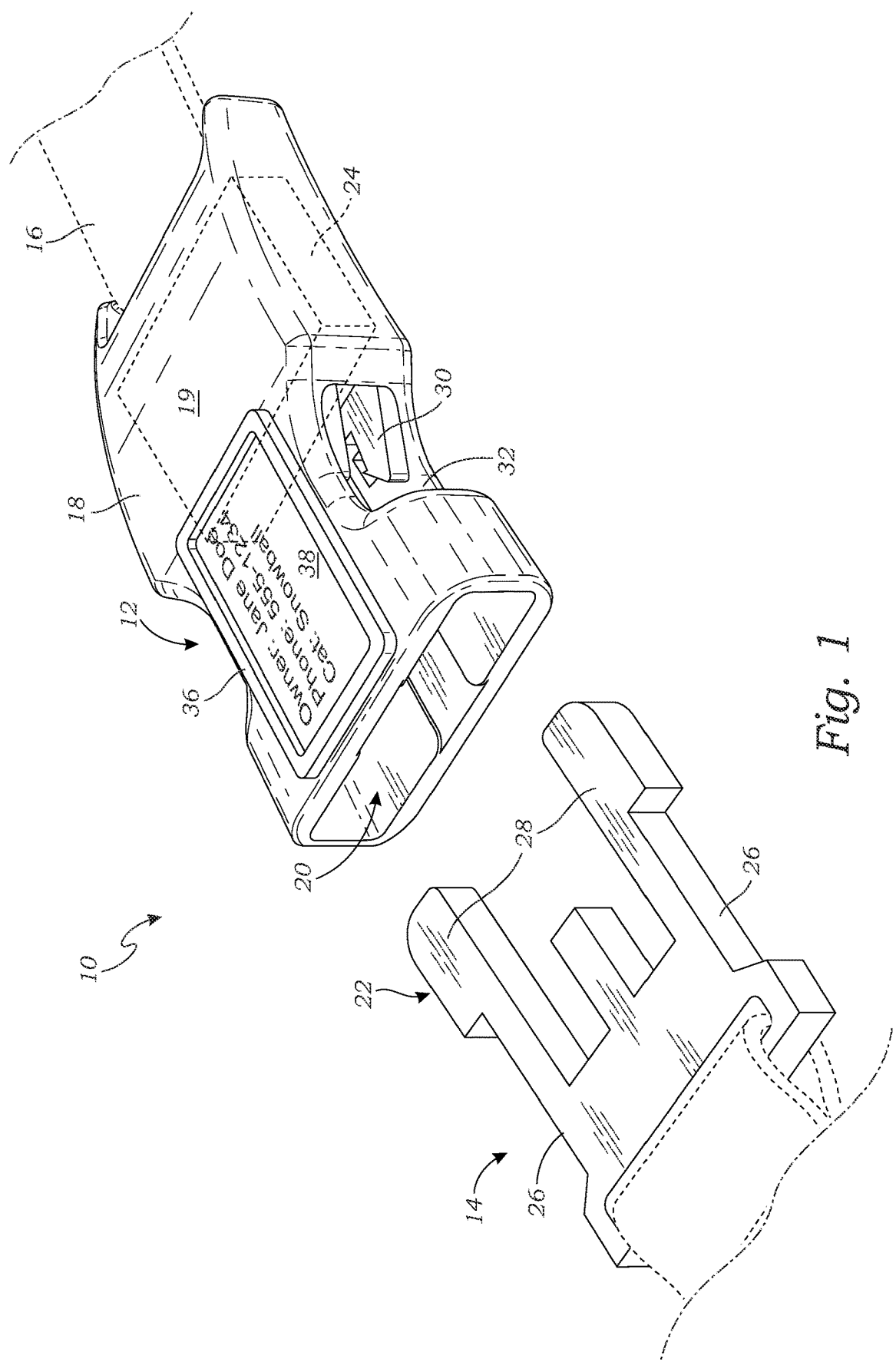
FIG. 1 is an exploded perspective view of a tracking device, according to one embodiment of the present invention, the tracking device of this embodiment including a tracking buckle, a mating buckle, and a collar.

FIG. 1 is an exploded perspective view of a tracking device 10, according to one embodiment of the present invention. The tracking device 10 of this embodiment includes a tracking buckle 12, a mating buckle 14, and a collar 16. As shown in FIG. 1, the tracking buckle 12 includes a buckle body 18, which can removably jointed with the mating buckle 14 via respective interlocking portions 20 and 22. The buckle body 18 further includes an internal chamber 24 for containing electronics for tracking the location of the device 10, as described in greater detail below.

In the embodiment of FIG. 1, the tracking buckle 12 is in the form of a side release buckle wherein the buckle body 18 has a female buckle portion 20, and the mating buckle 14 has a male buckle portion 22. The male buckle portion 22 of this embodiment includes a pair of resilient arms 26 which extend outwardly to engagement heads 28 that snap into receivers 30 of the female buckle portion 20. Side apertures 32 formed in side walls of the female buckle portion 20 function to receive the engagement heads 28, and enable a user to compress the engagement heads 28 to release the lock. The tracking buckle 12 and mating buckle 14 are connected at their opposite ends to a collar 16 or other similar structure that enables the tracking device 10 to be removably attached to any person, animal, or object that is desired to be tracked.

In this embodiment, the buckle body 18 of the tracking buckle 12 has a front surface 19 that includes a planar tag receiving area 34 surrounded by a frame 36 that is shaped to receive an identification tag 38 or other form of paper, sheet, or identifying item. This may include, for example, in the case of a pet, identification of the pet and the owner, and in the case of luggage, identification of the owner of the luggage. Any form of suitable identification may be included for mounting in the frame 36. The frame 36 may be in the form of an annular construction with a hooked cross section for containing the identification tag 38. A slot 37, shown in FIG. 3, may be provided in one side of the frame 36 for insertion of the identification tag 38 into the planar tag receiving area 34.

Figure 2:
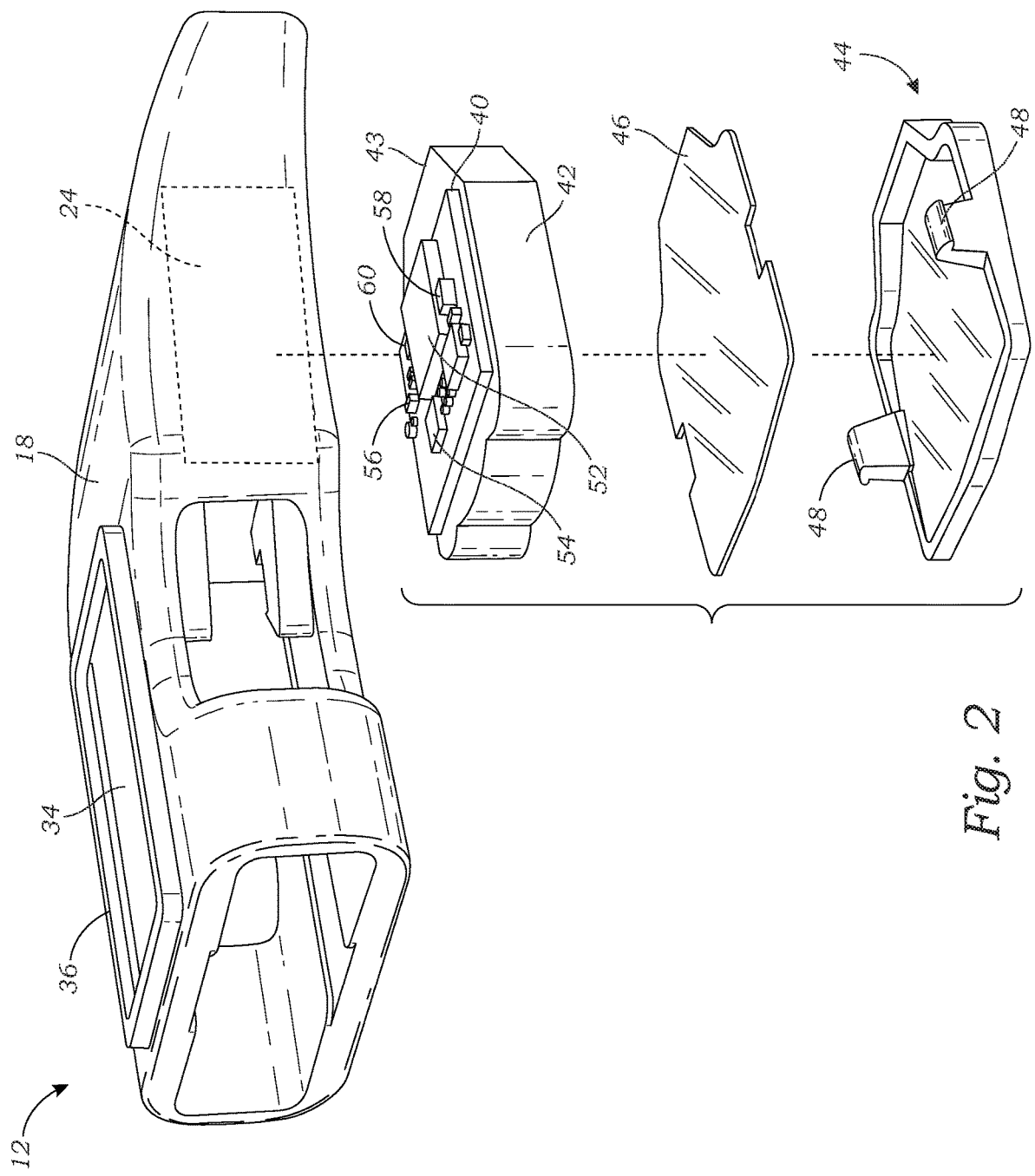
FIG. 2 is an exploded perspective view of the tracking buckle of FIG. 1.

FIG. 2 is another exploded perspective view of the tracking buckle 12 of FIG. 1, illustrating the electronics that may be included in the tracking device 10. As shown in FIG. 2, electronics may be insertable into the internal chamber 24 from below, although other methods of insertion may also be used. In this embodiment, the electronics include a printed circuit board (PCB) 40 or equivalent structure, mounted on a battery 42 that is sized and shaped to fit securely and snugly into the internal chamber 24, so there is minimal movement. The battery 42 preferably fits so that the PCB 40 is held in a manner such that the PCB 40 does not contact the buckle body 18, thereby protecting the PCB 40 from damage, as described in greater detail below. The PCB 40 may include a microcontroller or other form of computer processor 52, and a computer memory 54. The PCB 40 may further include, or be operably connected with, an accelerometer 56, a GPS 60, and any other electronics components that would enable the function of the tracking device 10, as discussed in greater detail below. Furthermore, the PCB 40 may further include, or be operably connected with, a transceiver 58, or other form of wireless communication device, for communicating (e.g., via Bluetooth®, or any other communication standard known in the art). The communication may be directly to outside computer devices (e.g., smart phone, tablet, PC, etc.), or via any form of network (e.g., cellular, WiFi, Bluetooth, and any other forms of network known in the art). These elements should be construed broadly to include any equivalent structures, standards, etc., which may be desired by one skilled in the art.

A cover 44 may be used to lock the battery 42 and PCB 40 within the internal chamber 24. In this embodiment, the cover 44 includes an engaging structure 48 for locking the battery 42 and PCB 40 within the internal chamber 24, and may accompany a planar sheet or gasket 46, or similar structure. In this case, the engaging structure 48 includes a pair of locking arms, although other engagement mechanisms may alternatively be used (e.g., threads, locking flanges, etc.).

Figure 3:
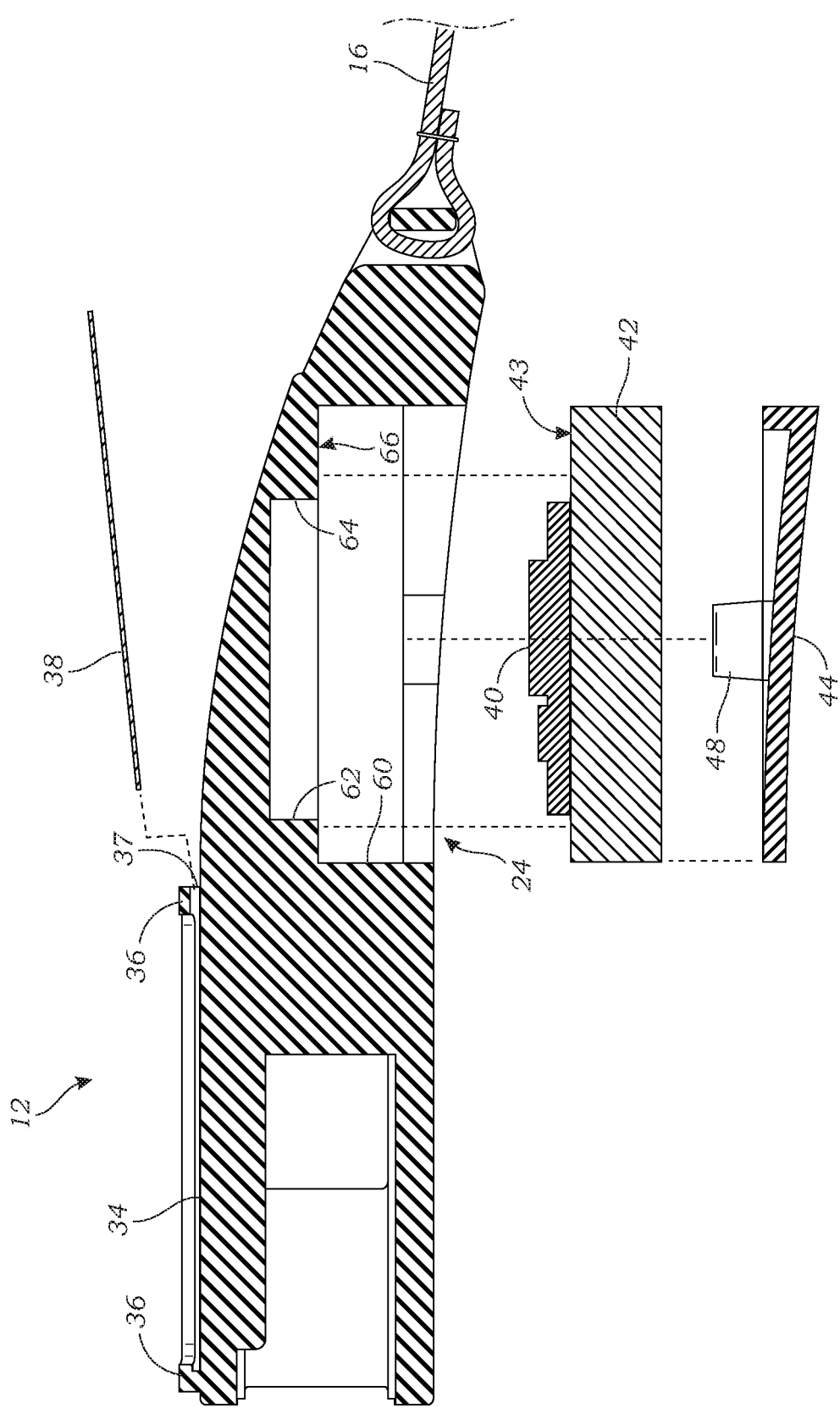
FIG. 3 is an exploded side sectional view of the tracking buckle.
Figure 4:
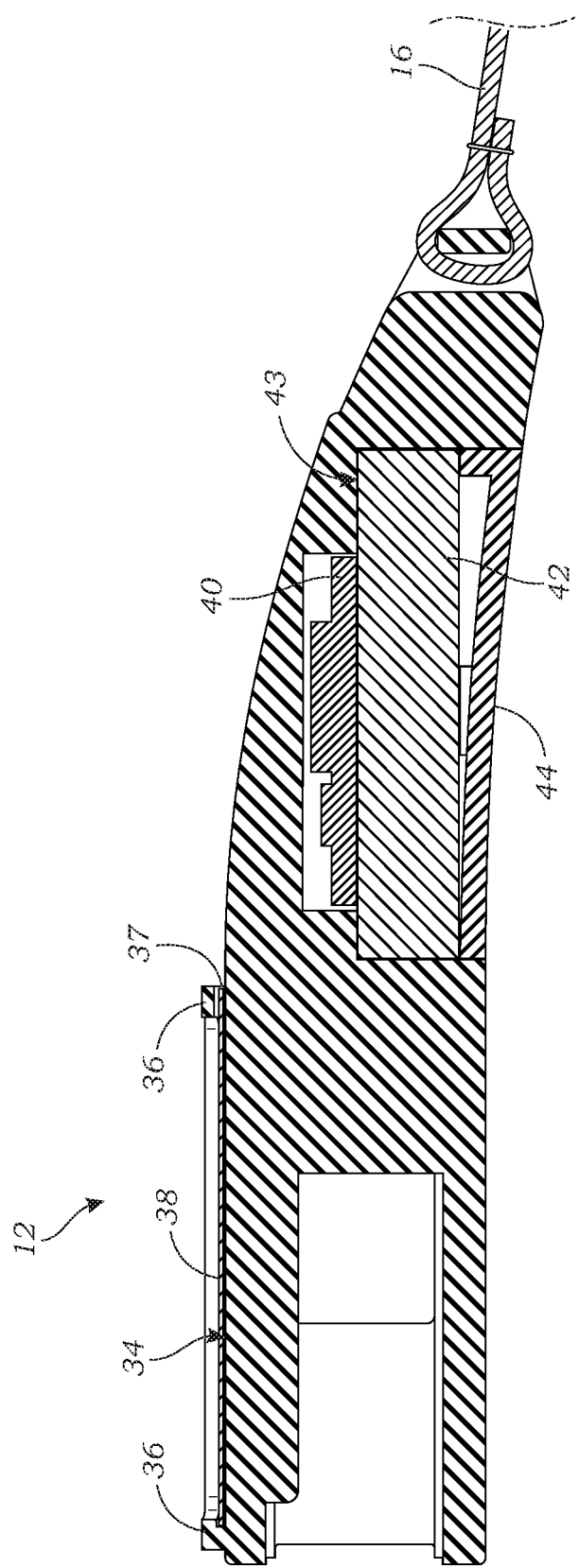
FIG. 4 is a side sectional view thereof once the components have been assembled.

FIG. 3 is an exploded side sectional view of the assembled tracking buckle 12 of FIGS. 1-2. FIG. 4 is a side sectional view thereof once the components have been assembled. As shown in FIGS. 3-4, the internal chamber 24 is shaped to accommodate both the battery 42 and the PCB 40. In this embodiment, the internal chamber 24 includes a lower chamber 60 (best shown in FIG. 3) that is large enough and shaped to receive and contain the battery 42 (as shown in FIG. 4). The battery 42 preferably frictionally engages the lower chamber 60 so there is a secure, snug fit.

A smaller upper chamber 62 is formed above the lower chamber 60, for receiving the PCB 40, and for not contacting the PCB 40, but for protecting the fragile electronics from damage. A shoulder 64 is formed between the chambers 60 and 62, so that a shoulder surface 66 contacts an upper surface 43 of the battery 42, holding the battery 42 securely in place once seated, while the PCB 40 is prevented from contacting the internal chamber 24 and being damaged.

In use, the tracking device 10 may be used to determine the location of the person, pet, or object to which the tracking device 10 is attached. The tracking device 10 may utilize the GPS 60, the accelerometer 56, a network signal, or other methods known in the art for determining the location of the device 10. The system may include a logic module which functions to: 1) monitor the location of the device 10; 2) compare the location of the device 10 to a predetermined safe zone; 3) to initiate outbound communication through a communication module, especially in the event that the device 10 moves outside of the predetermined area (e.g., geofence); 4) to receive inbound communication from the communication module; and 5) report the location of the device 10 in response to the received inbound communications.

In a second embodiment, the device 10 further comprises a speaker (not shown) for sounding an alert, or giving audible instructions, etc., in the event of the person, animal, or item leaving the geofence, or in response to instructions from a user.

The purpose of the communication module is to manage inbound and outbound communication. The communications module may send an out of bounds message and receive an instruction message through the network.

The power source may include a battery 42 as shown, or any other suitable technology, and may further include a charging port (not shown) or similar structure (e.g., induction charging) for recharging the device 10. Commercially available GPS, CDMA, or GPRS/GSM tracker modules can be used for the location module. The microcontroller 52 can be a commercially available Arduino® microcontroller, or any other form of controller or computer components known to those skilled in the art.

In one embodiment, the device 10 further comprises a means for counting steps, using, e.g., the accelerometer 56 or other electronics known in the art. The device may function as a step counter to determine distance traveled, steps taken, and/or any other desirable data metrics. This may be used by a person, a pet, or any other animal that is desired to be tracked. In the case of a pet (e.g., a dog), the step counter may track the number of steps taken (or other metric) to track the health of the pet, and to make sure that the pet gets enough exercise every day. An alert may be generated (e.g., audible, visual, text, email, pre-recorded voicemail, etc.) and delivered to the user using any means known in the art.

The device 10 may further include a means for sending reminders to associated parties, e.g., pet owners, etc. For example, at the end of the day, if the dog has not received enough exercise, the pet owner or caregiver may receive a text reminding him or her to take the dog for a walk. Daily, weekly, monthly, and annual reporting may be provided for tracking the long term health of the pet.

As used in this application, the words "a," "an," and "one" are defined to include one or more of the referenced item unless specifically stated otherwise. The terms "approximately" and "about" are defined to mean+/−10%, unless otherwise stated. Also, the terms "have," "include," "contain," and similar terms are defined to mean "comprising" unless specifically stated otherwise. Furthermore, the terminology used in the specification provided above is hereby defined to include similar and/or equivalent terms, and/or alternative embodiments that would be considered obvious to one skilled in the art given the teachings of the present patent application. While the invention has been described with reference to at least one particular embodiment, it is to be clearly understood that the invention is not limited to these embodiments, but rather the scope of the invention is defined by claims made to the invention.

What is claimed is:

1. A tracking device for tracking a location of the tracking device via a computer network, and for receiving an identification tag, the tracking device comprising:
 a buckle body that includes an interlocking portion that enables the buckle body to be removably jointed with a mating body, the buckle body further including an internal chamber;
 a front surface of the buckle body having a planar tag receiving area surrounded by a frame that is shaped to receive an identification tag; and
 electronics positioned within the internal chamber, the electronics comprising a printed circuit board mounted on and operably connected with a battery that is sized and shaped to fit securely and snugly into the internal chamber, so there is minimal movement therebetween, the printed circuit board comprising a computer processor, computer memory, an accelerometer, and a transceiver for communicating with the computer network.

2. The tracking device of claim 1, wherein the internal chamber is shaped to receive both the battery and the printed circuit board by forming a shoulder that keeps the battery in place but prevents the printed circuit board from contacting the internal chamber and being damaged.

3. The tracking device of claim 1, wherein the tracking device includes a collar that is connected to the tracking buckle, and which may be connected to the mating buckle.

4. The tracking device of claim 1, wherein the frame is in the form of an annular construction with a hooked cross section for containing the identification tag; and a slot is provided in one side of the frame for insertion of the identification tag into the planar tag receiving area.

5. The tracking device of claim 1, wherein a cover is used to lock the battery and PCB within the internal chamber, the cover comprising:
 an engaging structure integrally formed to a base cover for locking the battery and PCB within the internal chamber; and
 a gasket that is positioned between the engaging structure and the battery.

6. A tracking device comprising:
 a buckle body that includes an interlocking portion that enables the buckle body to be removably jointed with a mating body, the buckle body further including an internal chamber;
 a front surface of the buckle body having a planar tag receiving area surrounded by a frame that is shaped to receive an identification tag;
 electronics positioned within the internal chamber, the electronics comprising a printed circuit board mounted on and operably connected with a battery that is sized and shaped to fit securely and snugly into the internal chamber, so there is minimal movement therebetween, the printed circuit board comprising a computer processor, computer memory, an accelerometer, and a transceiver for communicating with the computer network;
 a mating buckle that removably engages the buckle body; and
 a collar connected to the buckle body and the mating buckle.

7. The tracking device of claim 6, further comprising a means for counting steps.

8. The tracking device of claim 6, further comprising a means for sending reminders.

\* \* \* \* \*